US010141485B1

United States Patent
Hur et al.

(10) Patent No.: US 10,141,485 B1
(45) Date of Patent: Nov. 27, 2018

(54) VEHICLE LAMP USING SEMICONDUCTOR LIGHT EMITTING DEVICE

(71) Applicant: LG Electronics Inc., Seoul (KR)

(72) Inventors: Jihwan Hur, Seoul (KR); Sejoon You, Seoul (KR); Jongmoo Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/885,081

(22) Filed: Jan. 31, 2018

(30) Foreign Application Priority Data

Nov. 3, 2017 (KR) .................. 10-2017-0146197

(51) Int. Cl.
*H01L 33/50* (2010.01)
*F21S 41/141* (2018.01)
*H01L 25/03* (2006.01)
*F21Y 115/10* (2016.01)

(52) U.S. Cl.
CPC .......... *H01L 33/508* (2013.01); *F21S 41/141* (2018.01); *H01L 25/03* (2013.01); *H01L 33/502* (2013.01); *H01L 33/505* (2013.01); *F21Y 2115/10* (2016.08)

(58) Field of Classification Search
CPC ..... H01L 33/508; H01L 33/505; H01L 25/03; H01L 33/502
See application file for complete search history.

(56) References Cited

U.S. PATENT DOCUMENTS

| 2010/0059769 A1* | 3/2010 | Jeong | ................. H01L 33/0079 257/94 |
| 2015/0084537 A1* | 3/2015 | Choi | ....................... H01L 33/20 315/250 |

* cited by examiner

*Primary Examiner* — Joseph L Williams
(74) *Attorney, Agent, or Firm* — Fish & Richardson P.C.

(57) ABSTRACT

A lamp for a vehicle includes a light source unit configured to emit light. The light source unit includes a substrate that includes a wiring electrode, a plurality of semiconductor light emitting devices electrically connected to the wiring electrode, a plurality of phosphor layers that respectively cover the plurality of semiconductor light emitting devices and that are configured to convert wavelengths of light, and barrier ribs disposed on the substrate and configured to reflect light, the barrier ribs being interposed between the plurality of semiconductor light emitting devices. A height of each of the barrier ribs exceeds a height of each of the plurality of semiconductor light emitting devices in a thickness direction of the plurality of semiconductor light emitting devices.

20 Claims, 9 Drawing Sheets

VEHICLE LAMP USING SEMICONDUCTOR LIGHT EMITTING DEVICE

CROSS-REFERENCE TO RELATED APPLICATIONS

Pursuant to 35 U.S.C. § 119(a), this application claims the benefit of earlier filing date and right of priority to Korean Application No. 10-2017-0146197, filed on Nov. 3, 2017, the contents of which is incorporated by reference herein in its entirety.

FIELD

This application relates to a vehicle lamp, and more particularly, a vehicle lamp using a semiconductor light emitting device.

BACKGROUND

A vehicle may include various lamps having lighting functions and signaling functions. For example, halogen lamps or gas discharge lamps are used, and in recent years, light emitting diodes (LEDs) are of interest as light sources for vehicle lamps.

The LED can enhance a degree of freedom for design of a lamp by minimizing a size thereof and bring an economical efficiency by virtue of a semi-permanent lifespan, but most of the LEDs are currently produced in a form of a package. In some examples, the LEDs have been under development as a semiconductor light emitting device that converts a current into light as an image displaying light source for an electronic device such as an information communication device.

In some cases, vehicle lamps including the LEDs in the package form may have a low mass production yield rate, high fabrication costs, and low flexibility.

Recently, intelligent lamps including a structure of selectively lighting a part of a lamp are under development. A structure included in a lamp may prevent interference between light emitted from each of a plurality of light emitting devices.

SUMMARY

One aspect of the present disclosure may provide a barrier rib structure, capable of preventing light emitted from each of semiconductor light emitting devices included in a vehicle lamp from interfering with each other.

Another aspect of the present disclosure may provide a fabricating method, capable of precisely forming a barrier rib structure, which is disposed between semiconductor light emitting devices included in a vehicle lamp, at a predetermined position, and freely adjusting width and height of the barrier rib structure.

According to one aspect of the subject matter described in this application, a lamp for a vehicle includes a light source unit configured to emit light. The light source unit includes a substrate that includes a wiring electrode, a plurality of semiconductor light emitting devices electrically connected to the wiring electrode, a plurality of phosphor layers that respectively cover the plurality of semiconductor light emitting devices and that are configured to convert wavelengths of light, and barrier ribs disposed on the substrate and configured to reflect light, the barrier ribs being interposed between the plurality of semiconductor light emitting devices. A height of each of the barrier ribs exceeds a height of each of the plurality of semiconductor light emitting devices in a thickness direction of the plurality of semiconductor light emitting devices.

Implementations according to this aspect may include one or more of the following features. For example, each of the barrier ribs may include a first barrier rib disposed on the substrate and made of a first material, and a second barrier rib disposed on the first barrier rib and made of a second material that is different from the first material. A height of the first barrier rib may be less than a height of the second barrier rib in the thickness direction. In some examples, a height of the first barrier rib may be less than a height of the plurality of semiconductor light emitting devices in the thickness direction. In some examples, a width of the first barrier rib is greater than a width of the second barrier rib in a width direction of the plurality of semiconductor light emitting devices.

In some implementations, an upper surface of each of the barrier ribs is located below an upper surface of each of the plurality of phosphor layers in the thickness direction. The lamp may further include electrode holes that respectively penetrate the plurality of phosphor layers to expose the plurality of semiconductor light emitting devices, and upper electrodes that are respectively disposed inside the electrode holes and electrically connected to the plurality of semiconductor light emitting devices. In some examples, the plurality of semiconductor light emitting devices and the plurality of phosphor layers are spaced apart from each other by a predetermined distance, respectively, and the light source unit further comprises an air gap or a light transmission layer disposed in a space that is defined between each semiconductor light emitting devices and each phosphor layer.

For example, the plurality of semiconductor light emitting devices and the plurality of phosphor layers may be spaced apart from each other by the predetermined distance, respectively, in the thickness direction. The plurality of semiconductor light emitting devices and the plurality of phosphor layers may be spaced apart from each other by the predetermined distance, respectively, in a width direction that is orthogonal to the thickness direction. In some examples, the plurality of phosphor layers may contact at least a portion of the plurality of semiconductor light emitting devices, respectively. A reflectivity of the second barrier rib may be greater than a reflectivity of the first barrier rib.

In some implementations, the lamp may further include an insulating layer that is disposed on the substrate and that covers the wiring electrode, and the insulating layer may contact the barrier ribs between the plurality of semiconductor light emitting devices. According to another aspect of the subject matter, a method for fabricating a lamp includes arranging a plurality of semiconductor light emitting devices on a substrate, depositing a seed layer made of a metal or an alloy on the substrate between the plurality of semiconductor light emitting devices, forming a phosphor layer that covers the plurality of semiconductor light emitting devices, etching a portion of the phosphor layer to expose the seed layer to an outside, and forming barrier ribs on the seed layer by applying a voltage to the seed layer in a plating solution.

Implementations according to this aspect may include one or more of the following features. The method may further include, based the seed layer being deposited, forming, before forming the phosphor layer, a light transmission layer that covers each semiconductor light emitting device. In this case, the phosphor layer is formed on the light transmission layer, and etching the portion of the phosphor layer includes etching the light transmission layer to expose the seed layer to the outside.

In some examples, forming the barrier ribs including forming the barrier ribs to have a width is less than a width of the seed layer. In other words, depositing the seed layer includes depositing the seed layer to have a width greater than a width of the barrier ribs. In some examples, forming the barrier ribs may include electroplating the barrier ribs with a material that is different from a material deposited in the seed layer.

In some implementations, forming the barrier ribs may include filling in the etched portion in the phosphor layer by electroplating the barrier ribs. Etching the portion of the phosphor layer may include etching the portion of the phosphor layer to define an opening that is narrower than a width of the seed layer. In some examples forming the light transmission layer may include forming the light transmission layer that covers each semiconductor light emitting device and the seed layer.

In some examples, light emitted from each of semiconductor light emitting devices included in a vehicle lamp may not interfere with each other in a manner of absorbing or reflecting light directed toward a side surface of the semiconductor light emitting device. When utilizing a structure disclosed herein together with an electrode structure capable of controlling the semiconductor light emitting devices based on a unit of a device, a part to of an entire region of the vehicle lamp can selectively be turned on.

Further, in a fabricating method, since a barrier rib structure is formed by plating, a position of the barrier rib structure can be adjusted through an arrangement of a seed metal, and a width and height of the barrier rib can be freely adjusted by adjusting a plating condition.

DETAILED DESCRIPTION

Description will now be given in detail according to exemplary implementations disclosed herein, with reference to the accompanying drawings.

A vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the implementations described herein may also be applied to a new product type that will be developed later if the device is a device capable of emitting light.

Figure 1:
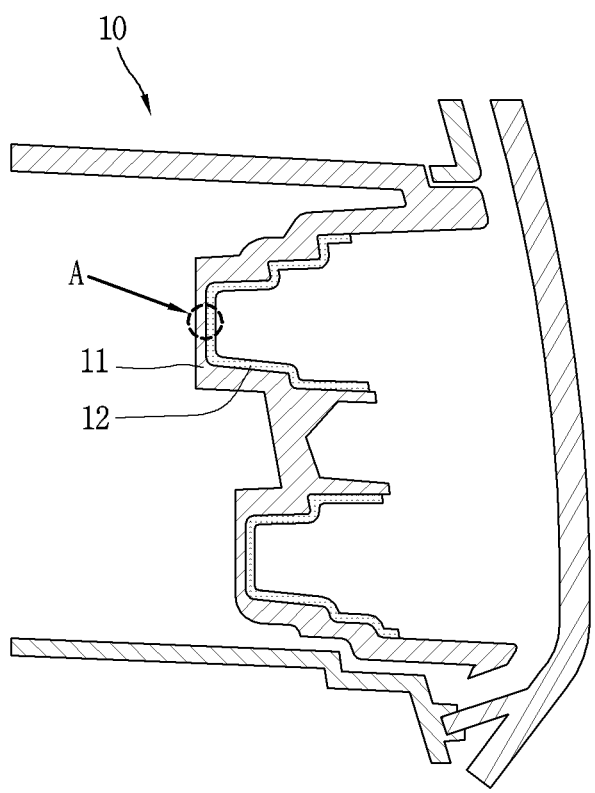
FIG. 1 is a conceptual view illustrating an example vehicle lamp using an example semiconductor light emitting device.

FIG. 1 is a conceptual view illustrating an example implementation of a vehicle lamp using a semiconductor light emitting device.

A vehicle lamp 10 includes a frame 11 fixed to a vehicle body, and a light source unit 12 installed on the frame 11.

A wiring line for supplying power to the light source unit 12 may be connected to the frame 11, and the frame 11 may be fixed to the vehicle body directly or by using a bracket. In some examples, the vehicle lamp 10 may be provided with a lens unit to more diffuse and sharpen light emitted from the light source unit 12.

The light source unit 12 may be a flexible light source unit that can be curved, bent, twisted, folded, or rolled by external force.

In a non-curved state of the light source unit 12 (for example, a state having an infinite radius of curvature, hereinafter, referred to as a first state), the light source unit 12 is flat. When the first state is switched to a state that the light source unit 12 is bent by external force (e.g., a state having a finite radius of curvature, hereinafter, referred to as a second state), the flexible light source unit may have a curved surface with at least part curved or bent.

A pixel of the light source unit 12 may be implemented by a semiconductor light emitting device. The present disclosure exemplarily illustrates a light emitting diode (LED) as a type of semiconductor light emitting device for converting current into light. The LED may be a light emitting device having a small size, and may thus serve as a pixel even in the second state.

For example, the light source unit 12 may include a unit light source, a base substrate, and a connection electrode. Hereinafter, the above-mentioned constituent elements (components) will be described in detail.

The light source unit 12 may be provided with the unit light source. Hereinafter, the unit light source will be described in detail based on the light source unit 12 provided with only the unit light source.

Figure 2:
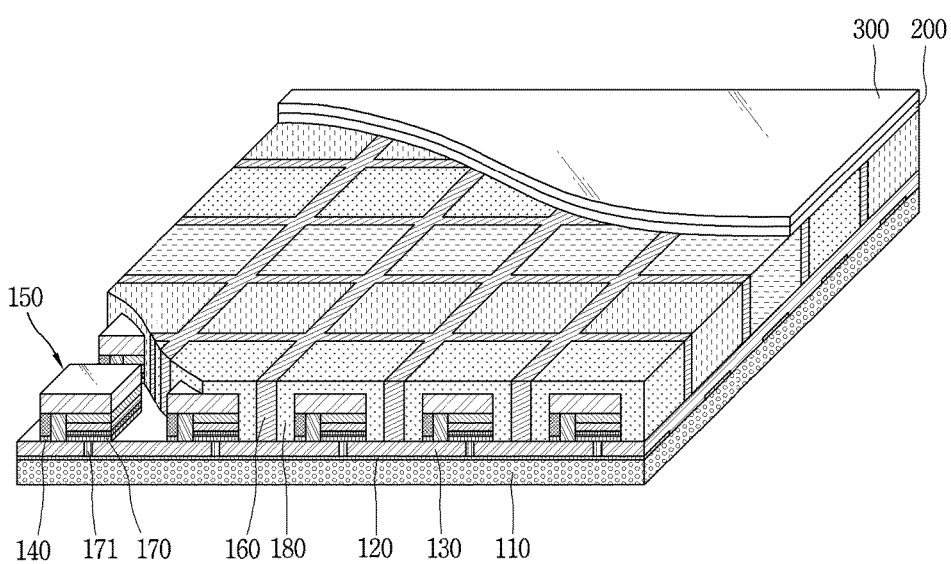
FIG. 2 is an enlarged view of the part A in FIG. 1.
Figure 3:
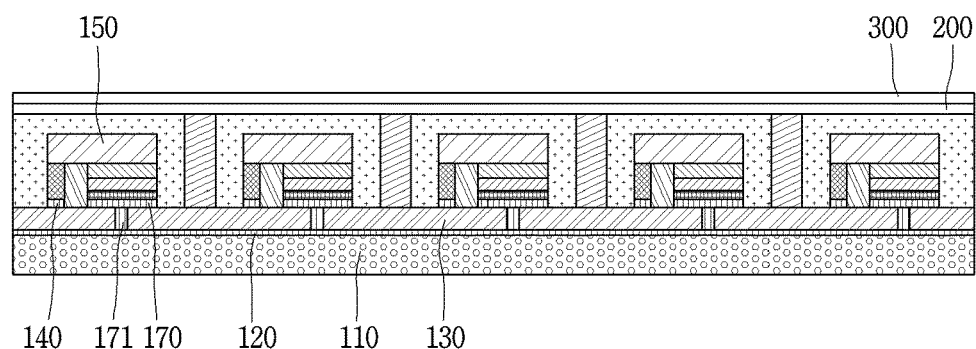
FIG. 3 is a sectional view of the semiconductor light emitting device of FIG. 2.
Figure 4:
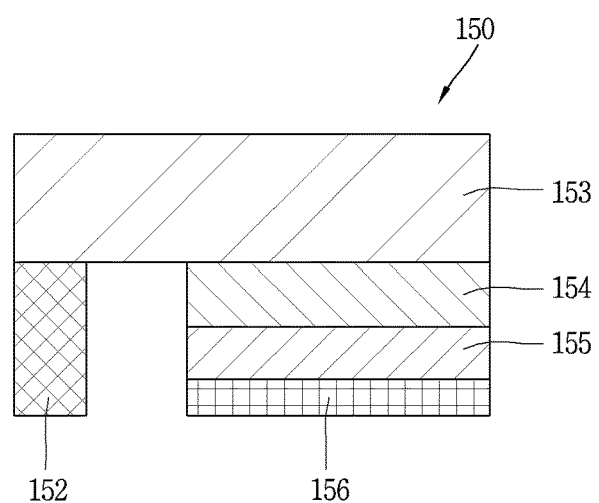
FIG. 4 is a conceptual view illustrating an example flip chip type semiconductor light emitting device of FIG. 3.

FIG. 2 is a partially enlarged view of a part A in FIG. 1, FIG. 3 is a sectional view thereof, and FIG. 4 is a conceptual view illustrating an example flip chip type semiconductor light emitting device of FIG. 3.

Referring to FIGS. 2, 3 and 4, a passive matrix (PM) type semiconductor light emitting device is used as the unit light source 100 using the semiconductor light emitting device. However, the example described hereinafter may also be applicable to an active matrix (AM) type semiconductor light emitting device.

The unit light source 100 includes a substrate 110, a first electrode 120, a second electrode 140, and a plurality of semiconductor light emitting devices 150.

The substrate 110 may serve as a base layer for a structure to be formed in the subsequent processes, and may be a wiring substrate on which the first electrode 120 is disposed. The substrate 110 may be formed of glass or polyimide (PI) to implement a flexible light source unit. In addition, the substrate 110 may be made of a thin metal. In addition, the substrate 110 may alternatively be made of any material with insulating property and flexibility, for example, polyethylene naphthalate (PEN), polyethylene terephthalate (PET), and the like. In some examples, the substrate 110 may be formed of any of a transparent material or an opaque material.

In some examples, a heat dissipating sheet, a heat sink, or the like may be mounted on the substrate 110 to provide a heat dissipating function. For example, the heat dissipating sheet, the heat sink, or the like may be mounted on an opposite surface to a surface on which the first electrode 120 is disposed.

The first electrode 120 is disposed on the substrate 110, and may be formed as a plate-shaped electrode. Therefore, the first electrode 120 may be an electrode layer disposed on the substrate, and may serve as a data electrode.

As illustrated in FIG. 2, an insulating layer 130 may be disposed on the substrate 110 on which the first electrode 120 is located, and auxiliary electrodes 170 may be disposed on the insulating layer 130. In this case, the state in which the insulating layer 130 is laminated on the substrate 110 may be a single wiring substrate. In some examples, the insulating layer 130 may be formed of a flexible insulating material, such as polyimide (PI), PET, or PEN, and may be formed integrally with the substrate 110 to form a single substrate.

The auxiliary electrode 170 is an electrode that electrically connects the first electrode 120 and the semiconductor light emitting devices 150, and is disposed on the insulating layer 130 to correspond to a position of the first electrode 120. For example, the auxiliary electrode 170 may have a dot-like shape and may be electrically connected to the first electrode 120 through an electrode hole 171 formed through the insulating layer 130. The electrode hole 171 may be formed by filling a conductive material in a via hole.

In some examples, the semiconductor light emitting device 150 may provide a brightness to constitute an individual unit pixel even though it has a small size. The individual semiconductor light emitting device 150 may have a size of 80 μm or less on one side, and may have a rectangular or square shape. In this case, an area of the single semiconductor light emitting device is in the range of $10^{-10}$ to $10^{-5}$ m$^2$, and an interval between the light emitting devices may be in the range of 100 μm to 10 mm.

Referring to FIG. 4, the semiconductor light emitting device may be a flip chip type light emitting device.

For example, each semiconductor light emitting device includes a p-type electrode 156, a p-type semiconductor layer 155 on which the p-type electrode 156 is formed, an active layer 154 formed on the p-type semiconductor layer 155, an n-type electrode 153 formed on the active layer 154, and an n-type electrode 152 disposed on the n-type semiconductor layer 153 with being spaced apart from the p-type electrode 156 in a horizontal direction. In this case, the p-type electrode 156 may be electrically connected to the auxiliary electrode 170, and the n-type electrode 152 may be electrically connected to the second electrode 140.

Referring back to FIGS. 2 and 3, the auxiliary electrode 170 may extend long in a direction, and an auxiliary electrode may be electrically connected to the plurality of semiconductor light emitting devices 150. For example, the p-type electrodes of the left and right semiconductor light emitting devices based on the auxiliary electrode may be electrically connected to one auxiliary electrode.

In addition, the plurality of semiconductor light emitting devices 150 may constitute a light emitting device array, and phosphor layers 180 are formed on the light emitting device array.

The light emitting device array may include a plurality of semiconductor light emitting devices having different brightness values. Each of the semiconductor light emitting devices 150 may constitute a unit pixel and be electrically connected to the first electrode 120. For example, the first electrode 120 may be provided in a plurality. The semiconductor light emitting devices, for example, may be arranged in multiple rows, and the semiconductor light emitting devices in each row may be electrically connected to one of the plurality of first electrodes.

In addition, since the semiconductor light emitting devices are connected in a form of a flip chip, the semiconductor light emitting devices grown on a transparent dielectric substrate may be used. The semiconductor light emitting devices may be, for example, nitride semiconductor light emitting devices. Since the semiconductor light emitting device 150 has excellent brightness, it may constitute an individual unit pixel even though it has a small size.

In some examples, the second electrode 140 is located between the semiconductor light emitting devices 150 and is electrically connected to the semiconductor light emitting devices 150. For example, the semiconductor light emitting devices 150 may be disposed in a plurality of rows, and the second electrode 140 may be disposed between the rows of the semiconductor light emitting devices 150.

In this case, the second electrode 140 may be located between the semiconductor light emitting devices 150 because a distance between the semiconductor light emitting devices 150 forming the individual pixels is sufficiently large. In addition, the second electrode 140 may be formed as a bar-like electrode which is long in one direction.

For example, a color filter 200 may also be laminated on the phosphor layers 180 to improve color purity of converted light. In addition, the color filter 200 may be covered with a passivation layer 300 to protect a light source unit from moisture, oxygen, and external impact. For example, the passivation layer 300 may be formed by bonding a film or coating resin.

In some examples, barrier ribs 160 may be formed between the semiconductor light emitting devices 150 to prevent light emitted from each of the semiconductor light emitting devices from interfering with each other. In this case, the barrier rib 160 may serve to separate the individual unit pixels from each other.

The barrier ribs 160 may be formed higher than the semiconductor light emitting devices in a thickness direction of the semiconductor light emitting device. Accordingly, the barrier rib 160 absorbs or reflects not only light emitted from the semiconductor light emitting device but also light output from the phosphor layer disposed on the semiconductor light emitting device. Specifically, the barrier rib 160 absorbs or reflects light emitted from the semiconductor light emitting device and light which is directed toward a side of the semiconductor light emitting device among light output from the phosphor layer.

In some examples, the barrier rib 160 may be formed of a material having a high light absorption rate or a white material having high reflectance. In some cases, the material having a high light absorption may be called a black material. In some examples, the barrier rib 160 may be made of a glossy metal or alloy, including but not limited to Ni, Cr, Cu, or the like, which has a high reflectance.

The barrier rib 160 and the phosphor layer 180 may be implemented in various forms. Hereinafter, various implementations constituting the barrier rib 160 and the phosphor layer 180 will be described.

Hereinafter, for convenience of description, description of the other components of the components, which constitute the light source unit, except for the semiconductor substrate 110, the semiconductor light emitting device 150, the barrier rib 160 and the phosphor layer 180, will be omitted, but those skilled in the art may easily understand those components which are not described with reference to FIGS. 2 to 4.

Figure 5A:
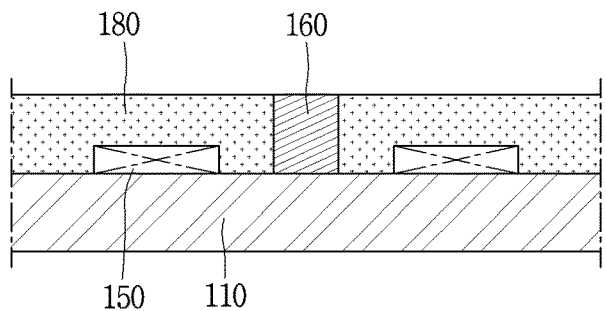
FIGS. 5A to 5C are sectional views illustrating the part A in FIG. 1.

Referring to FIGS. 2, 3 and 5A, the phosphor layer 180 may be disposed to surround a side surface and an upper surface of the semiconductor light emitting device 150. In this case, any other layer may be not interposed between the semiconductor light emitting device 150 and the phosphor layer 180, and light emitted from the semiconductor light emitting device 150 is converted in the phosphor layer 180.

Figure 5B:
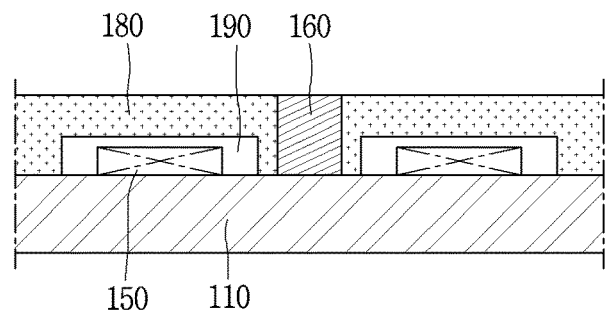

Referring to FIG. 5B, an optical gap 190 may be formed between the phosphor layer 180 and the semiconductor light emitting device 150. The optical gap 190 may be filled with air or may be made of transparent resin. In this case, the light emitted from the semiconductor light emitting device 150 and directed to the side surface of the semiconductor light emitting device 150 is absorbed by the phosphor layer 180 through the optical gap 190.

Figure 5C:
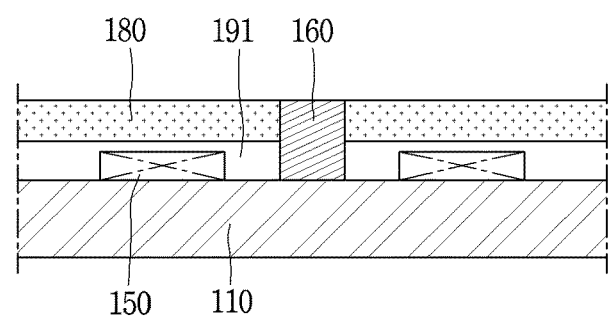

Referring to FIG. 5C, an optical gap layer 191 may be disposed beneath the phosphor layer 180. The optical gap layer 191 may be filled with air or may be made of transparent resin. Unlike the structure of FIG. 5B, referring to a structure illustrated in FIG. 5C, the light emitted from the semiconductor light emitting device 150 and directed to the side surface of the semiconductor light emitting device 150 is absorbed by the barrier rib through the optical gap layer 191, or reflected by the barrier rib.

In some implementations, the optical gap layer 191 may be used as a structure for electrically connecting the semiconductor light emitting device 150 to a wiring electrode. For example, the optical gap layer 191 may be a layer having adhesiveness and conductivity. In some examples, a material having conductivity and a material having adhesiveness may be mixed in the optical gap layer 191. The optical gap layer 191 also has ductility to enable flexible functionality in the vehicle lamp.

As an example, the optical gap layer 191 may be an anisotropic conductive film (ACF), an anisotropic conductive paste, a solution containing conductive particles, or the like. The optical gap layer 191 may be configured as a layer allowing an electric interconnection in a Z direction penetrating through its thickness, but having electric insulation in a horizontal X-Y direction. Accordingly, the optical gap layer 191 may be referred to as a Z-axis conductive layer.

The anisotropic conductive film is a film in which an anisotropic conductive medium is mixed with an insulating base member. When heat and pressure are applied, only a specific portion obtains conductivity by the anisotropic conductive medium. Hereinafter, description will be given of an example that heat and pressure are applied to the anisotropic conductive film, but other methods may alternatively be used to allow the anisotropic conductive film to partially have conductivity. Examples of the other methods may be a method of applying one of the heat and the pressure, a UV curing method, and the like.

The anisotropic conductive medium may be, for example, a conductive ball or a conductive particle. The anisotropic conductive film may be a film in which conductive balls are mixed with an insulating base member. In some cases, when heat and pressure are applied, only a specific portion may obtain conductivity by the conductive balls. For example, the anisotropic conductive film may contain a plurality of particles each of which includes a core of a conductive material that is coated with an insulating film made of a polymer material. In this case, a portion of the insulating film, where heat and pressure are applied, is broken and thus obtains conductivity by the core. In some cases, the shape of the core may be deformed to form a layer brought into contact with each other in a thickness direction of the film. In some examples, heat and pressure are applied to the entire anisotropic conductive film, and an electric connection in the Z-axis direction is partially formed due to a height difference of an object adhered by the anisotropic conductive film.

In some examples, the anisotropic conductive film may contain a plurality of particles each of which includes an insulating core coated with a conductive material. In this case, a portion of the conductive material, to which heat and pressure are applied, is deformed (stuck, pressed) and thus the portion has conductivity in the thickness direction of the film. As an another example, the conductive material may penetrate through the insulating base member in the Z-axial direction such that the film has conductivity in its thickness direction. In this case, the conductive material may have a sharp end portion.

In some examples, the anisotropic conductive film may be a fixed array anisotropic conductive film (ACF) in which conductive balls are inserted into one surface of the insulating base member. For example, the insulating base member may be formed of a material having adhesiveness, and the conductive balls are concentrated on a bottom portion of the insulating base member. When heat and pressure are applied to the base member, the film is deformed together with the conductive balls so as to obtain conductivity in a perpendicular direction.

However, the present disclosure is not limited thereto. The anisotropic conductive film may alternatively be formed by randomly inserting conductive balls into the insulating base member, or may be configured in a form of double-ACF in which plural layers are formed and the conductive balls are inserted into one of the layers.

The anisotropic conductive paste may include a combination of a paste and conductive balls, for example, may be a paste in which conductive balls are mixed with a base material having insulating property and adhesiveness. In some examples, the solution containing conductive particles may be a solution in which conductive particles or nano particles are contained.

In some examples where a width of the barrier rib, as described in the light source illustrated in FIGS. 5A to 5C, is multiple tens of micrometers, it may be difficult to accurately form the barrier rib at a predetermined position and at a predetermined height. In some cases, when the barrier rib has a height exceeding a predetermined height, durability of the barrier rib may be deteriorated, and thereby the barrier rib may be damaged during fabrication of the light source.

Before describing a barrier rib structure, a fabricating method for freely adjusting the height of the barrier rib will be described.

Figure 6:
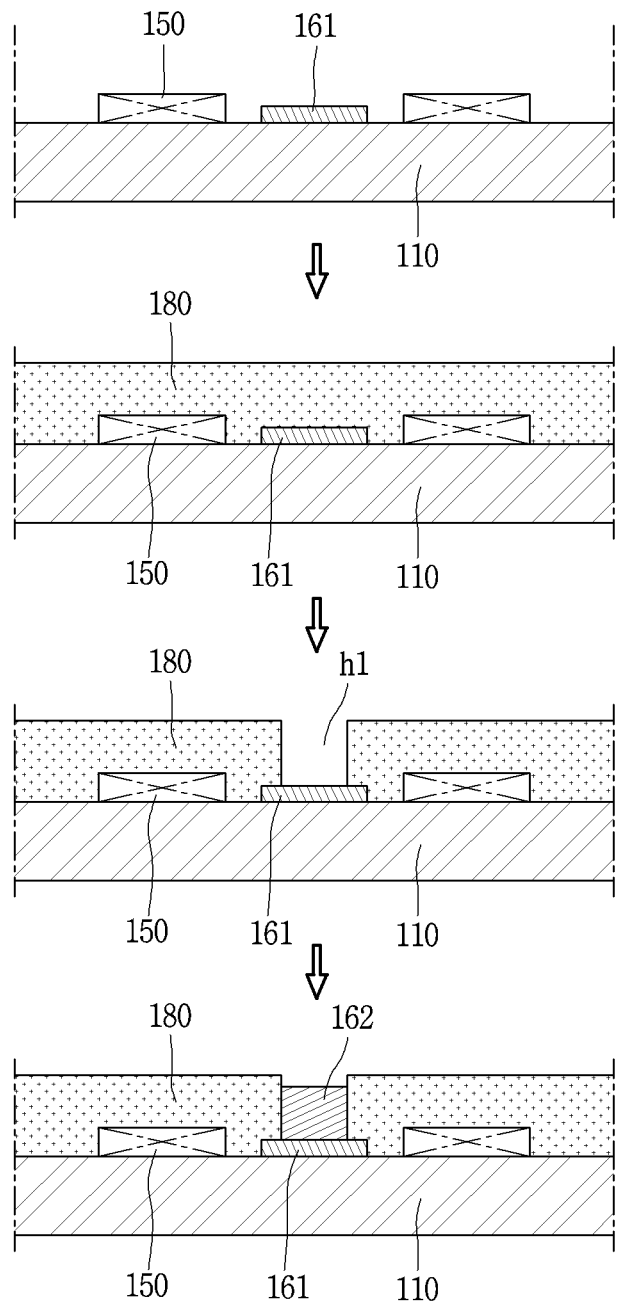
FIGS. 6 and 7 are conceptual views illustrating an example fabricating method.
Figure 7:
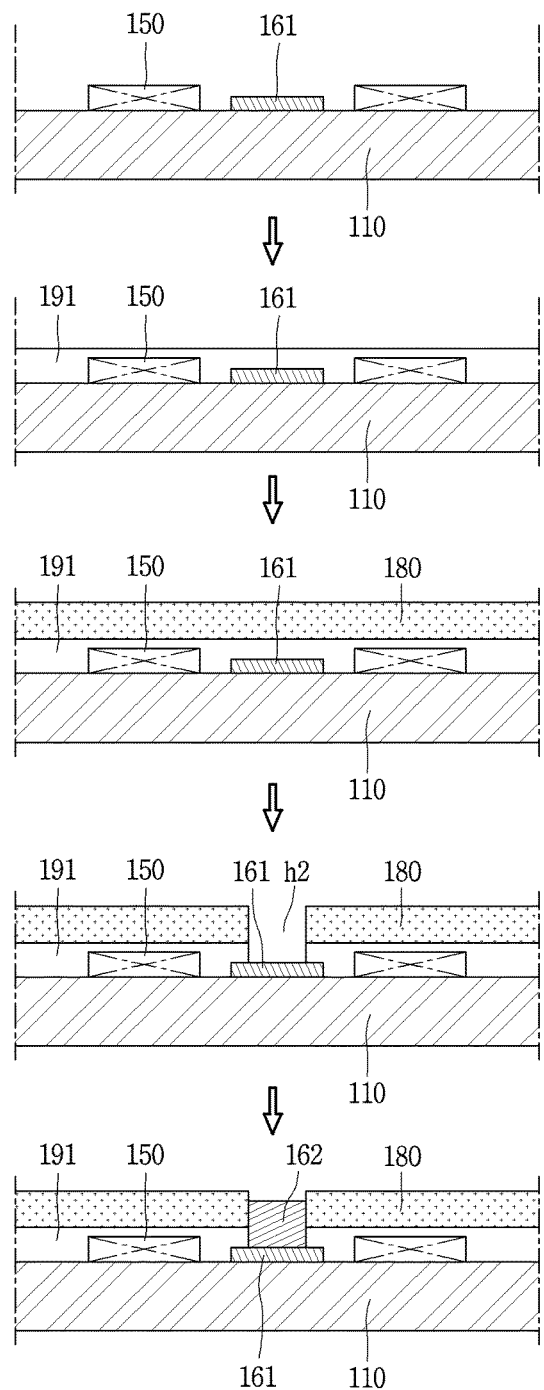

FIGS. 6 and 7 are conceptual views illustrating an example fabricating method.

Referring to FIG. 6, a first step of arranging a plurality of semiconductor light emitting devices on a substrate is performed. For example, a first conductive semiconductor layer, an active layer and a second conductive semiconductor layer may be disposed on a growth substrate. The method may include an etching step to generate the semiconductor light emitting devices, and a. A first conductive electrode 156 and a second conductive electrode 152 may be formed after the etching step.

The growth substrate (e.g., a wafer) may be formed of a material having optical transparency, including but not limited to one of sapphire (Al2O3), GaN, ZnO, or AlO. In some examples, the growth substrate may be made of a material suitable for growing a semiconductor material such as a carrier wafer. The growth substrate may also be formed of a material having a high thermal conductivity. The growth substrate 110 may use, for example, a SiC substrate having a higher thermal conductivity than a sapphire (Al2O3) substrate. In some examples, the growth substrate 110, in addition to a conductive substrate or an insulating substrate, may use at least one of Si, GaAs, GaP, InP, or Ga2O3.

The first conductive electrode 156 and the first conductive semiconductor layer may be a p-type electrode and a p-type semiconductor layer, respectively. The second conductive electrode 152 and the second conductive semiconductor layer may be an n-type electrode and an n-type semiconductor layer, respectively. However, the present disclosure is not necessarily limited thereto, and may alternatively be applied to an example in which the first conductive type is the n-type and the second conductive type is the p-type.

Next, the semiconductor light emitting devices are bonded to the wiring substrate, and the growth substrate is removed. When the semiconductor light emitting devices are coupled to the wiring substrate, a conductive adhesive layer may be utilized.

The wiring substrate is in a state with first and second electrodes formed thereon, and the first and second conductive electrodes are electrically connected to the first and second electrodes, respectively, through the conductive adhesive layers or the like.

In some examples, as illustrated in FIGS. 2 and 3, when the insulating layer 130 is formed on the substrate, the semiconductor light emitting devices may be disposed on the wiring electrode formed on the insulating layer 130. Hereinafter, components disposed on the substrate may also be disposed on the insulating layer 130 described in FIGS. 2 and 3, depending on a manner of constituting the wiring electrode.

Next, a second step of depositing a seed layer, which is made of a metal or an alloy, between the semiconductor light emitting devices is performed.

The barrier rib may be formed through electroplating. In order to perform the electroplating, a seed layer 161, which acts as an electrode for plating, should be formed on the substrate. In order to increase a bonding force between the substrate 110 and the seed layer 161, an adhesive layer may be deposited on the substrate 110 in advance. The adhesive layer may be made of a metal such as Ti, TiN, Cr, or the like, and the seed layer 161 may be made of Au, Cu, or the like.

Next, a third step of forming a phosphor layer covering the semiconductor light emitting devices is performed.

The phosphor layer 180 may be formed by coating resin mixed with a phosphor on the substrate and curing the resin mixed with the phosphor. In this case, the phosphor layer 180 has the structure described in FIG. 5A.

In some examples, a method of fabricating the phosphor layer 180 in a plate form and then bonding the phosphor layer 180 to the substrate may be utilized. For example, the plate-shaped phosphor layer 180 may be fabricated by baking phosphor powder into a plate form, and forming a recessed structure on one surface of the plate by wet etching or dry etching. Here, the recessed structure should be formed at a position where the semiconductor light emitting device is disposed.

When the phosphor layer is formed by the phosphor plate, a gap may be formed between the semiconductor light emitting device and the phosphor layer. For example, when the phosphor layer is formed by the phosphor plate, the structure as illustrated in FIG. 5B may be formed. When the phosphor plate is adhered to the substrate after transparent resin is filled in the recessed structure, an optical gap made of the transparent resin may be formed between the semiconductor light emitting device and the phosphor layer.

Next, a fourth step of etching a part of the phosphor layer to externally expose the seed layer is performed.

The phosphor layer 180 formed in the third step covers the semiconductor light emitting device 150 and the seed layer 161. In order to perform plating using the seed layer 161, the seed layer 161 should be exposed to the outside. To expose the seed layer 161, the step of etching the phosphor layer 180 is performed. A region that overlaps the seed layer 161 in the phosphor layer 180 should be etched. For example, when the seed layer 161 is disposed on the substrate into a mesh form, the phosphor layer 180 must also be etched into a mesh form.

Etching of the phosphor layer may be performed by wet etching or dry etching.

For example, a hole h1 may be formed through etching. The hole h1 serves as a mold for forming the aforementioned barrier rib. The structure of the barrier rib may vary depending on a shape of the hole h1. The width of the barrier rib may be adjusted by adjusting a width of the hole h1.

A fifth step of forming the barrier rib on the seed layer by applying a plating solution while applying a voltage to the seed layer is performed.

When a voltage is applied to the seed layer 161 in the plating solution after the seed layer 161 is exposed to the outside, a metal starts to be deposited on the seed layer 161. Here, the deposited metal may be a glossy metal. When a concentration of the plating solution, a plating time, intensity of the applied voltage, or the like is adjusted, a height of the barrier rib may be adjusted.

In some examples, as illustrated in FIG. 7, the fabricating method according to the disclosure may further include a step of forming a light transmission layer 191 which covers the semiconductor light emitting device before performing the third step after performing the second step. The light source fabricated by the fabricating method has the structure illustrated in FIG. 5C.

The light transmission layer 191 may be the anisotropic conductive film. In some examples, the light transmission layer 191 may be used to electrically connect the semiconductor light emitting device 150 to the wiring substrate, and the phosphor layer 180 may be formed on the anisotropic conductive film. In this case, the seed layer 161 is covered with the light transmission layer 191. In order to form the barrier rib, the seed layer 161 should be exposed to the outside. Accordingly, when the light transmission layer 191 is formed, a part of the phosphor layer and a part of the light transmission layer must be etched in the fourth step. For example, regions of the phosphor layer 180 and the light transmission layer 191 that overlap the seed layer 161 should be etched. A side surface of a hole h2 formed in this way may be defined by the phosphor layer 180 and the light transmission layer 191.

As described above, according to the fabricating method of the present disclosure, since the barrier rib structure is formed by plating, the position of the barrier rib structure can be adjusted through the arrangement of the seed metal, and the width and height of the barrier rib can be adjusted by adjusting a plating condition.

Hereinafter, a structure of a light source fabricated according to the aforementioned fabricating method will be described in more detail. Hereinafter, the seed layer is referred to as a first barrier rib, and the metal layer plated on the seed layer is referred to as a second barrier rib.

FIGS. 8A to 9C are sectional views briefly illustrating a part A in FIG. 1.

Figure 8A:
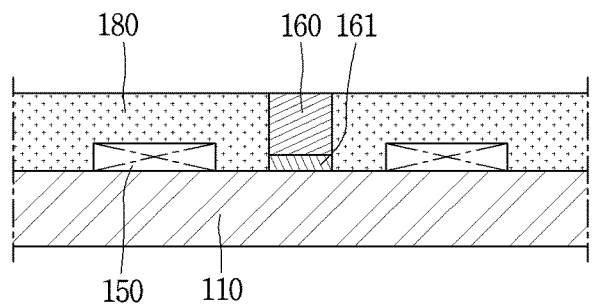
FIGS. 8A to 8C are sectional views illustrating the part A in FIG. 1.
Figure 8B:
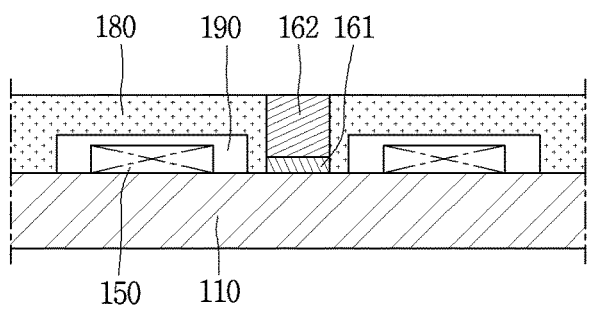
Figure 8C:
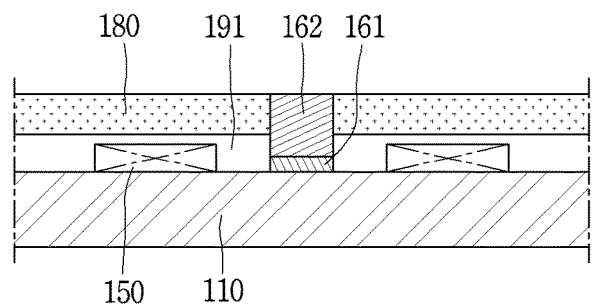

Referring to FIGS. 8A to 8C, a height of a first barrier rib 161 is lower than a height of a second barrier rib 162 in the thickness direction of the semiconductor light emitting device 150. Since the first barrier rib 161 is formed of a metal for applying a voltage during plating, the metal forming the first barrier rib 161 may have lower reflectance than a metal forming the second barrier rib 162. In this case, the second barrier rib 162 is formed to be higher than the first barrier rib 161 so that an amount of light directed toward the second barrier rib 162 is greater than an amount of light directed toward the first barrier rib 161. Thus, reflection may occur substantially on the second barrier rib 162 having relatively high reflectance.

In some examples, the first barrier rib 161 may be formed to be lower than the semiconductor light emitting devices 150 in the thickness direction of the semiconductor light emitting device 150. When the first barrier rib 161 is made of a metal having lower reflectivity than the second barrier rib 162, light directed toward a side surface of the semiconductor light emitting device may be directed toward the second barrier rib 162. To this end, the first barrier rib 161 should be formed as thin as possible. Accordingly, most of light directed toward the side surface of the semiconductor light emitting device may be directed to the second barrier rib 162.

Figure 9A:
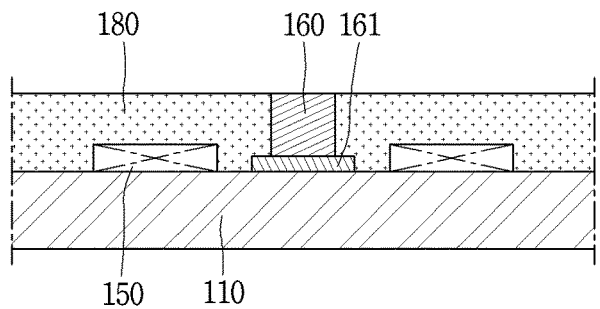
FIGS. 9A to 9C are sectional views illustrating the part A in FIG. 1.
Figure 9B:
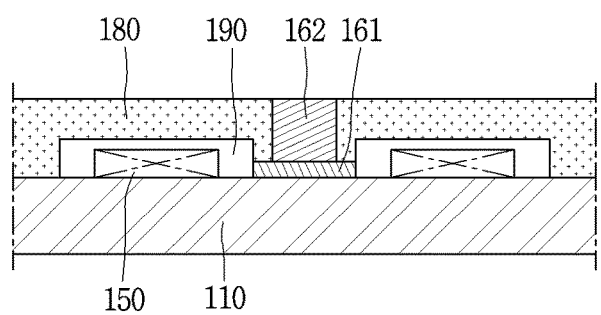
Figure 9C:
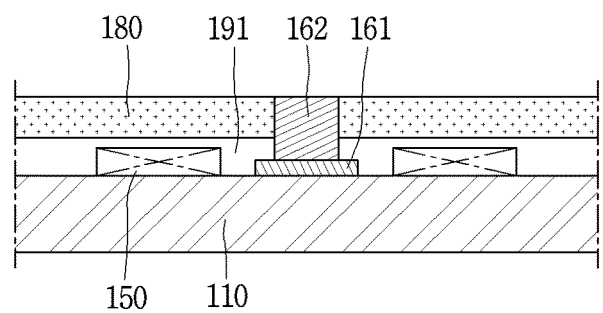

In some examples, as illustrated in FIGS. 9A to 9C, a width of the first barrier rib 161 may be larger than a width of the second barrier rib 162. Since the first barrier ribs 161 may be lost during the process of etching the phosphor layer described with reference to FIGS. 6 and 7, the first barrier rib 161 may be formed as wide as possible. Accordingly, even if a part of the first barrier rib 161 is lost during the process of etching the phosphor layer 180, the first barrier rib 161 can maintain adhesion with the second barrier rib 162. In addition, when the first barrier rib 161 is formed wide, the first barrier rib 161 may reflect a part of light directed to a lower side of the semiconductor light emitting device, thereby increasing a light amount of the light source.

The foregoing description has been given of the implementation in which the light source is configured by using the flip chip type semiconductor light emitting device. However, the present disclosure may also be applied to a vertical type semiconductor light emitting device as well as the flip chip type.

FIG. 9 is a conceptual view illustrating a cross section of a vertical type semiconductor light emitting device.

Referring to FIG. 9, the vertical type semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to the first electrode 120, and the n-type electrode 152 located at the top may be electrically connected to the second electrode 140. Since the vertical type semiconductor light emitting device 150 may have the electrodes arranged on the top and bottom thereof, a reduction of a chip size can be achieved.

Since the second electrode 140 electrically connected to the n-type electrode 152 is disposed on the semiconductor light emitting device 150 when the light source is constructed using the vertical type semiconductor light emitting device, a short-circuit between the second electrode 140 and the barrier rip made of the metal may be caused.

The present disclosure provides a structure for solving such a problem.

Figure 10:
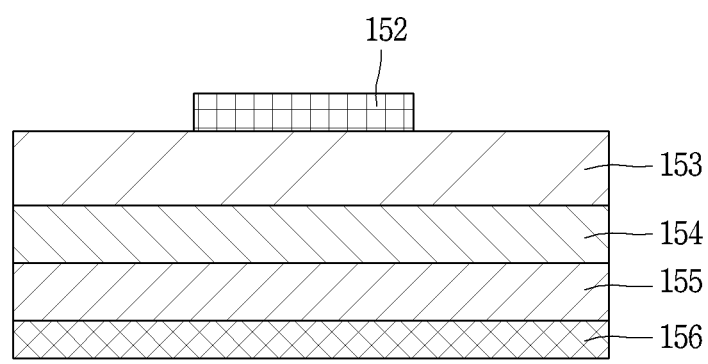
FIG. 10 is a conceptual view illustrating a cross-section of an example vertical type semiconductor light emitting device.
Figure 11:
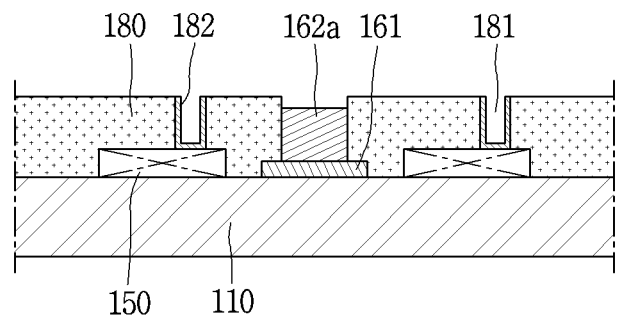
FIG. 11 is a sectional view illustrating an example light source using an example vertical type semiconductor light emitting device.

FIG. 10 is a sectional view schematically illustrating a light source using a vertical type semiconductor light emitting device.

When a light source is constructed using a vertical type semiconductor light emitting device, each of barrier ribs formed on a substrate may be formed to be lower than an upper surface of the phosphor layer in the thickness direction of the semiconductor light emitting device. When the light source is constructed into the structures described with reference to FIGS. 5A to 5C using the vertical type semiconductor light emitting device, the second electrode 140 must be formed on the phosphor layer. To prevent the second electrode 140 and the barrier rib 160 from being short-circuited, the barrier wall, as illustrated in FIG. 10, should be formed to be lower than the upper surface of the phosphor layer.

For additional insulation, an insulating material may be deposited on the barrier rib formed lower than the upper surface of the phosphor layer. In this case, the second electrode 140 may be disposed on the insulating material.

A hole 181 may be formed in the phosphor layer so that the second electrode 140 disposed on the phosphor layer 180 is electrically connected to the vertical type semiconductor light emitting device 150, and a connection electrode 182 for electrically connecting the second electrode 140 to the semiconductor light emitting device 150 may be disposed in the hole 181.

Accordingly, the present disclosure can prevent the short-circuit between the wiring electrode and the barrier rib even when the light source is constructed using the vertical type semiconductor light emitting device.

It will be apparent to those skilled in the art that the present disclosure can be embodied in other specific forms without departing from the spirit or essential characteristics thereof.

Therefore, it should also be understood that the above-described implementations to are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:
1. A lamp for a vehicle, comprising:
   a light source unit configured to emit light, the light source unit comprising:
      a substrate that includes a wiring electrode,
      a plurality of semiconductor light emitting devices electrically connected to the wiring electrode,
      a plurality of phosphor layers that respectively cover the plurality of semiconductor light emitting devices and that are configured to convert wavelengths of light, and
      barrier ribs disposed on the substrate and configured to reflect light, the barrier ribs being interposed between the plurality of semiconductor light emitting devices,
   wherein a height of each of the barrier ribs exceeds a height of each of the plurality of semiconductor light emitting devices in a thickness direction of the plurality of semiconductor light emitting devices.

2. The lamp of claim 1, wherein each of the barrier ribs comprises:

a first barrier rib disposed on the substrate and made of a first material; and a second barrier rib disposed on the first barrier rib and made of a second material that is different from the first material.

3. The lamp of claim 2, wherein a height of the first barrier rib is less than a height of the second barrier rib in the thickness direction.

4. The lamp of claim 2, wherein a height of the first barrier rib is less than a height of the plurality of semiconductor light emitting devices in the thickness direction.

5. The lamp of claim 2, wherein a width of the first barrier rib is greater than a width of the second barrier rib in a width direction of the plurality of semiconductor light emitting devices.

6. The lamp of claim 1, wherein an upper surface of each of the barrier ribs is located below an upper surface of each of the plurality of phosphor layers in the thickness direction.

7. The lamp of claim 6, further comprising:

electrode holes that respectively penetrate the plurality of phosphor layers to expose the plurality of semiconductor light emitting devices; and upper electrodes that are respectively disposed inside the electrode holes and electrically connected to the plurality of semiconductor light emitting devices.

8. The lamp of claim 1, wherein the plurality of semiconductor light emitting devices and the plurality of phosphor layers are spaced apart from each other by a predetermined distance, respectively, and wherein the light source unit further comprises an air gap or a light transmission layer disposed in a space that is defined between each semiconductor light emitting devices and each phosphor layer.

9. The lamp of claim 8, wherein the plurality of semiconductor light emitting devices and the plurality of phosphor layers are spaced apart from each other by the predetermined distance, respectively, in the thickness direction.

10. The lamp of claim 8, wherein the plurality of semiconductor light emitting devices and the plurality of phosphor layers are spaced apart from each other by the predetermined distance, respectively, in a width direction that is orthogonal to the thickness direction.

11. The lamp of claim 1, wherein the plurality of phosphor layers contact at least a portion of the plurality of semiconductor light emitting devices, respectively.

12. The lamp of claim 2, wherein a reflectivity of the second barrier rib is greater than a reflectivity of the first barrier rib.

13. The lamp of claim 1, further comprising an insulating layer that is disposed on the substrate and that covers the wiring electrode, wherein the insulating layer contacts the barrier ribs between the plurality of semiconductor light emitting devices.

14. A method for fabricating a lamp, the method comprising:

arranging a plurality of semiconductor light emitting devices on a substrate;

depositing a seed layer made of a metal or an alloy on the substrate between the plurality of semiconductor light emitting devices;

forming a phosphor layer that covers the plurality of semiconductor light emitting devices;

etching a portion of the phosphor layer to expose the seed layer to an outside; and forming barrier ribs on the seed layer by applying a voltage to the seed layer in a plating solution.

15. The method of claim 14, further comprising:

based the seed layer being deposited, forming, before forming the phosphor layer, a light transmission layer that covers each semiconductor light emitting device, wherein the phosphor layer is formed on the light transmission layer, and wherein etching the portion of the phosphor layer includes etching the light transmission layer to expose the seed layer to the outside.

16. The method of claim 14, wherein depositing the seed layer includes depositing the seed layer to have a width greater than a width of the barrier ribs.

17. The method of claim 14, wherein forming the barrier ribs includes electroplating the barrier ribs with a material that is different from a material deposited in the seed layer.

18. The method of claim 14, wherein forming the barrier ribs includes filling in the etched portion in the phosphor layer by electroplating the barrier ribs.

19. The method of claim 14, wherein etching the portion of the phosphor layer includes etching the portion of the phosphor layer to define an opening that is narrower than a width of the seed layer.

20. The method of claim 15, wherein forming the light transmission layer includes forming the light transmission layer that covers each semiconductor light emitting device and the seed layer.

* * * * *